US012604719B2

(12) United States Patent
Cho et al.

(10) Patent No.:  US 12,604,719 B2
(45) Date of Patent:      Apr. 14, 2026

(54) SEMICONDUCTOR DEVICE HAVING A THROUGH-VIA STRUCTURE ELECTRICALLY CONNECTED TO A CONTACT STRUCTURE

(71) Applicant: SAMSUNG ELECTRONICS CO., LTD., Suwon-si (KR)

(72) Inventors: Sohye Cho, Hwaseong-si (KR); Kwangjin Moon, Hwaseong-si (KR); Hojin Lee, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 452 days.

(21) Appl. No.: 18/075,535

(22) Filed: Dec. 6, 2022

(65) Prior Publication Data

US 2023/0253293 A1     Aug. 10, 2023

(30) Foreign Application Priority Data

Feb. 4, 2022    (KR) ........................ 10-2022-0014643

(51) Int. Cl.
H01L 23/48        (2006.01)
B82Y 10/00        (2011.01)
(Continued)

(52) U.S. Cl.
CPC ........... H01L 23/481 (2013.01); H10D 30/43 (2025.01); H10D 30/6735 (2025.01);
(Continued)

(58) Field of Classification Search
CPC . H01L 23/481; H01L 21/76895; H01L 25/50; H01L 2224/05025;
(Continued)

(56) References Cited

U.S. PATENT DOCUMENTS 8,860,229 B1    10/2014  Lin
10,727,205 B2 *  7/2020  Wu ......................... H01L 25/50
(Continued)

FOREIGN PATENT DOCUMENTS

KR        1020200052497 A     5/2020
KR        1020210012084 A     2/2021
(Continued)

*Primary Examiner* — Sonya McCall-Shepard
(74) *Attorney, Agent, or Firm* — Muir Patent Law, PLLC

(57)              ABSTRACT

A semiconductor device includes a first semiconductor substrate having a protruding active pattern, a gate structure, a source/drain region in the active pattern on a side of the gate structure, an interlayer insulating layer on the source/drain region, a contact structure connected to the source/drain region through the interlayer insulating layer, a through-via structure electrically connected to the contact structure and passing through the interlayer insulating layer and the first semiconductor substrate, a first bonding structure including a first insulating layer on the first semiconductor substrate and a first connection pad in the first insulating layer, a second bonding structure on the first bonding structure and including a second insulating layer bonded to the first insulating layer and a second connection pad in the second insulating layer and bonded to the first connection pad, and a second semiconductor substrate disposed on the second bonding structure.

20 Claims, 15 Drawing Sheets

(51) Int. Cl.

| | |
|---|---|
| *H01L 21/768* | (2006.01) |
| *H01L 23/00* | (2006.01) |
| *H01L 23/485* | (2006.01) |
| *H01L 23/528* | (2006.01) |
| *H01L 23/538* | (2006.01) |
| *H01L 25/00* | (2006.01) |
| *H01L 25/065* | (2023.01) |
| *H10D 30/43* | (2025.01) |
| *H10D 30/67* | (2025.01) |
| *H10D 62/10* | (2025.01) |
| *H10D 62/13* | (2025.01) |
| *H10D 64/23* | (2025.01) |
| *H10D 84/01* | (2025.01) |
| *H10D 84/03* | (2025.01) |
| *H10D 84/83* | (2025.01) |

(52) U.S. Cl.
CPC ....... *H10D 30/6757* (2025.01); *H10D 62/121* (2025.01); *H10D 62/151* (2025.01)

(58) Field of Classification Search
CPC ... H01L 2224/05026; H01L 2224/0557; H01L 2224/05571; H01L 2224/80895; H01L 2224/80896; H01L 21/76898; H01L 23/5286; H01L 24/05; H01L 24/80; H01L 25/0657; H01L 2225/06503; H01L 2225/06541; H01L 23/535; H01L 23/5226; H01L 21/76897; H01L 23/50; H10D 30/6735; H10D 64/251; H10D 84/0149
See application file for complete search history.

(56) References Cited

U.S. PATENT DOCUMENTS

| | | | |
|---|---|---|---|
| 10,985,057 B2 | 4/2021 | Jourdain et al. | |
| 11,004,789 B2 | 5/2021 | Doornbos et al. | |
| 11,121,080 B2 * | 9/2021 | Sasaki .................. | H01L 23/481 |
| 2014/0124951 A1 * | 5/2014 | Lee ...................... | H01L 23/585 |
| | | | 257/774 |
| 2015/0021771 A1 | 1/2015 | Lin | |
| 2020/0373331 A1 | 11/2020 | Kim et al. | |
| 2021/0028112 A1 | 1/2021 | Kim et al. | |
| 2021/0134705 A1 | 5/2021 | Ma | |
| 2021/0202458 A1 | 7/2021 | Jung et al. | |
| 2021/0280585 A1 | 9/2021 | Jin | |
| 2021/0305381 A1 | 9/2021 | Chiang et al. | |
| 2021/0391302 A1 * | 12/2021 | Kao .................. | H01L 23/53228 |
| 2023/0187314 A1 * | 6/2023 | Senapati ............... | H10B 63/30 |
| | | | 365/163 |

FOREIGN PATENT DOCUMENTS

| | | |
|---|---|---|
| KR | 1020210053537 A | 5/2021 |
| KR | 1020210083429 A | 7/2021 |

* cited by examiner

A1

A2

SEMICONDUCTOR DEVICE HAVING A THROUGH-VIA STRUCTURE ELECTRICALLY CONNECTED TO A CONTACT STRUCTURE

CROSS-REFERENCE TO RELATED APPLICATION

This application claims benefit of priority to Korean Patent Application No. 10-2022-0014643, filed on Feb. 4, 2022, in the Korean Intellectual Property Office, the disclosure of which is incorporated herein by reference in its entirety.

BACKGROUND

1. Field

Embodiments relate to a semiconductor device.

2. Description of the Related Art

In various semiconductor devices, e.g., logic circuits and memories, active regions, e.g., a source and a drain, may be connected to a metal wiring of a back end of line (BEOL) through a contact structure. For example, at least a portion of the BEOL, e.g., a power line, may be connected to an element located on a backside of a substrate.

SUMMARY

According to an aspect of embodiments, a semiconductor device includes a first semiconductor substrate having a first surface and a second surface located opposite to each other and having an active pattern protruding from the first surface and extending in a first direction; a gate structure disposed in a region of the active pattern and extending in a second direction, intersecting the first direction; a source/drain region disposed in the active pattern on both sides of the gate structure; an interlayer insulating layer disposed on the source/drain region; a contact structure connected to the source/drain region through the interlayer insulating layer; a through-via structure electrically connected to the contact structure and passing through the interlayer insulating layer and the first semiconductor substrate; a first bonding structure including a first insulating layer disposed on the second surface of the first semiconductor substrate and a first connection pad embedded in the first insulating layer and connected to the through-via structure; a second bonding structure disposed on the first bonding structure and including a second insulating layer bonded to the first insulating layer and a second connection pad embedded in the second insulating layer and disposed to be bonded to the first connection pad; and a second semiconductor substrate disposed on the second bonding structure.

According to an aspect of embodiments, a semiconductor device includes a device substrate structure including a first semiconductor substrate having a first surface and a second surface located opposite to each other and having an active pattern protruding from the first surface and extending in a first direction, an interlayer insulating layer disposed on the active pattern, a through-via structure electrically connected to the active pattern and passing through the interlayer insulating layer and the first semiconductor substrate, and a first wiring portion disposed on the interlayer insulating layer; a first bonding structure including a first insulating layer disposed on the second surface of the first semiconductor substrate and a first connection pad embedded in the first insulating layer and connected to the through-via structure; a second bonding structure disposed on the first bonding structure and including a second insulating layer bonded to the first insulating layer and a second connection pad embedded in the second insulating layer and disposed to be bonded to the first connection pad; a power supply substrate structure including a second wiring portion disposed on the second bonding structure and a second semiconductor substrate having a through-via connected to the second wiring portion; and a support substrate disposed on the first wiring portion.

According to an aspect of embodiments, a semiconductor device includes a first semiconductor substrate having a first surface and a second surface located opposite to each other and having an active pattern protruding from the first surface and extending in a first direction; a gate structure disposed in a region of the active pattern and extending in a second direction, intersecting the first direction; a source/drain region disposed in the active pattern on both sides of the gate structure; an interlayer insulating layer disposed on the source/drain region; a contact structure connected to the source/drain region through the interlayer insulating layer; a through-via structure electrically connected to the contact structure, passing through the interlayer insulating layer and the first semiconductor substrate, and having a portion protruding from the second surface of the first semiconductor substrate; a first insulating layer disposed on the second surface of the first semiconductor substrate and having a surface coplanar with a surface of the protruded portion of the through-via structure; a bonding structure disposed on the first insulating layer and including a second insulating layer bonded to the first insulating layer and a connection pad embedded in the second insulating layer and disposed to be bonded to the surface of the protruded portion; and a second semiconductor substrate disposed on the bonding structure.

BRIEF DESCRIPTION OF DRAWINGS

Features will become apparent to those of skill in the art by describing in detail exemplary embodiments with reference to the attached drawings, in which.

DETAILED DESCRIPTION

Figure 1:
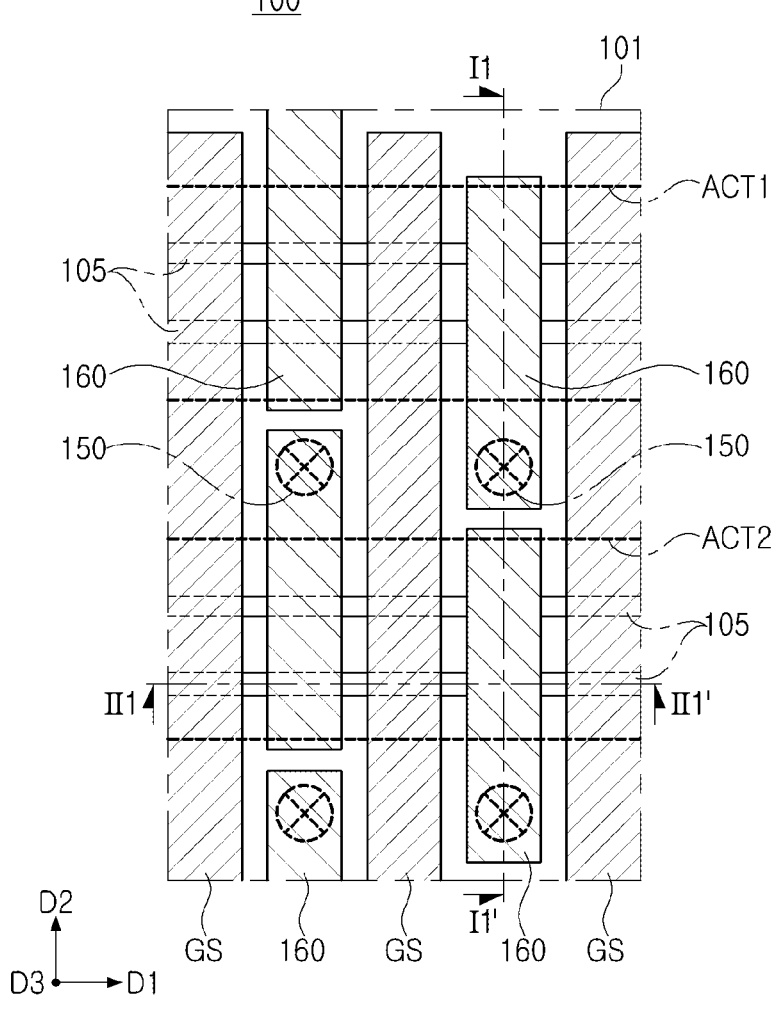
FIG. 1 is a plan view illustrating a semiconductor device according to an example embodiment.
Figure 2:
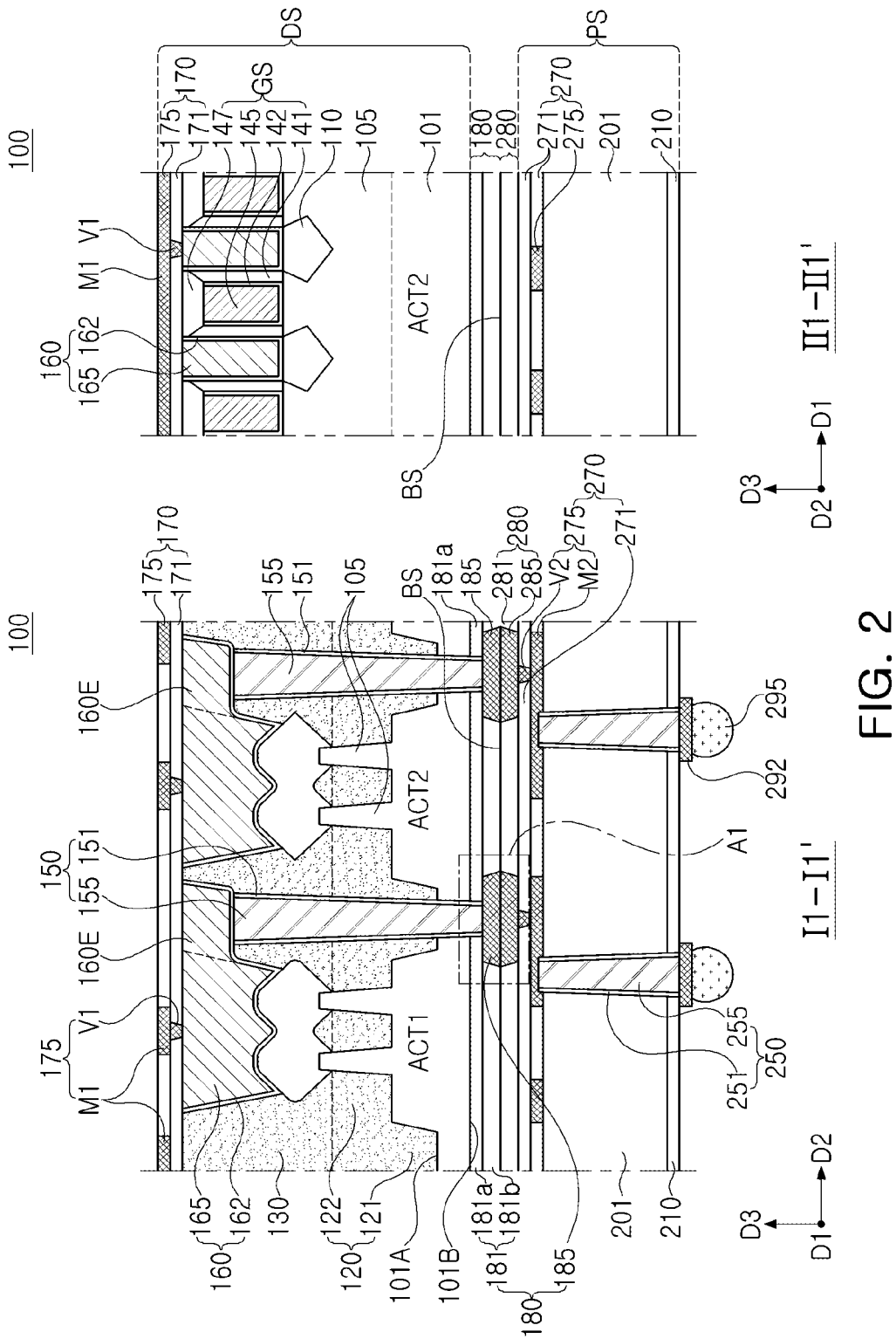
FIG. 2 is a cross-sectional view along lines I1-I1' and II1-II1' of FIG. 1.

FIG. 1 is a plan view illustrating a semiconductor device according to an example embodiment, and FIG. 2 is a cross-sectional view of the semiconductor device illustrated in FIG. 1, taken along lines I-I' and Referring to FIGS. 1 and 2, a semiconductor device 100 according to the present embodiment may include a device substrate structure DS having a first semiconductor substrate 101, a first bonding structure 180 disposed on a lower surface of the device substrate structure DS, a second bonding structure 280 bonded to the first bonding structure 180 to form an electrical path, and a power supply substrate structure PS having a second semiconductor substrate 201. The first and second bonding structures 180 and 280 may bond the first and second semiconductor substrates 101 and 201 to each other.

The device substrate structure DS may include a plurality of active patterns 105 protruding from upper surfaces of active regions ACT1 and ACT2 of the first semiconductor substrate 101 and extending, e.g., lengthwise, in a first direction (e.g., D1); a gate structure GS disposed in a region of the plurality of active patterns 105 and extending, e.g., lengthwise, in a second direction (e.g., D2), intersecting (e.g., or perpendicular to) the first direction (e.g., D1), a source/drain region 110 disposed in the plurality of active patterns 105 on both sides of the gate structure GS, an interlayer insulating layer 130 disposed on a first surface 101A of the first semiconductor substrate 101 and covering the source/drain region 110, a contact structure 160 connected to the source/drain region 110 through the interlayer insulating layer 130, and a through-via structure 150 electrically connected to the contact structure 160 and passing through the interlayer insulating layer 130 and the first semiconductor substrate 101.

In some example embodiments, the first semiconductor substrate 101 may include a semiconductor, e.g., Si or Ge, or a compound semiconductor, e.g., SiGe, SiC, GaAs, InAs, or InP. In other example embodiments, the first semiconductor substrate 101 may have a silicon on insulator (SOI) structure. The first semiconductor substrate 101 may include the first surface 101A and a second surface 101B opposite to each other, with the first surface 101A having the plurality of active patterns 105, and the second surfaces 101B (i.e., the backside of the first semiconductor substrate 101) facing the first semiconductor substrate 101.

The active regions ACT1 and ACT2 may be conductive regions, e.g., a well doped with an impurity or a structure doped with an impurity. The active region employed in the present example embodiment may include a first active region ACT1 and a second active region ACT2 having different conductivity types. For example, the first active region ACT1 may be an n-type well for a PMOS transistor, and the second active region ACT2 may be a p-type well or a p-type substrate for an NMOS transistor.

Each of the plurality of active patterns 105 has a structure protruding upwardly in a third direction D3 from upper surfaces of the first and second active regions ACT1 and ACT2, and is also referred to as an "active fin". The third direction D3 may be perpendicular to the upper surface of the first semiconductor substrate 101, e.g., perpendicular to the first and second directions D1 and D2.

As illustrated in FIG. 2, the plurality of active patterns 105 may be arranged side by side on the upper surfaces of the first and second active regions ACT1 and ACT2 to extend, e.g., lengthwise, in the first direction (e.g., D1). The plurality of active patterns 105 may be provided as active regions of each transistor. In the present example embodiment, the plurality of active patterns 105 are provided as two active patterns 105 in the source/drain regions 110, but embodiments are not limited thereto, e.g., the plurality of active patterns 105 may be provided as a single active pattern or three or more active patterns in other example embodiments.

The source/drain regions 110 may be respectively formed in partial regions of the plurality of active patterns 105 positioned on both sides of the gate structure GS. In the present example embodiment, as for the source/drain regions 110, recesses may be formed in partial regions of the plurality of active patterns 105, and selective epitaxial growth (SEG) may be performed in the recesses so that the source/drain region 110 may have an upper surface having a level higher than an upper surface of the plurality of active patterns 105. This source/drain region 110 is also referred to as a raised source/drain (RSD). For example, the source/drain region 110 may be formed of Si, SiGe, or Ge, and may have either an N-type or a P-type conductivity type. When a P-type source/drain region 110 is formed, it may be regrown with SiGe, and, e.g., boron (B), indium (In), gallium (Ga), boron trifluoride (BF3), or the like, may be doped as the P-type impurity. When an N-type source/drain region 110 is formed of silicon (Si), e.g., phosphorus (P), nitrogen (N), arsenic (As), antimony (Sb), and the like, may be doped as the N-type impurity. The source/drain region 110 may have different shapes along the crystallographically stable surface during a growth process. For example, as illustrated in FIG. 2, the source/drain region 110 may have a pentagonal cross-section (e.g., in the case of ACT1, P-type) or may have a hexagonal or polygonal cross-section having a gentle angle (e.g., in the case of ACT2, N-type).

The device substrate structure DS may include a device separation layer 120. The device separation layer 120 may include a first separation layer 121 defining the first and second active regions ACT1 and ACT2 and a second separation layer 122 defining the plurality of active patterns 105. The first separation layer 121 has a bottom surface deeper than the second separation layer 122. The first separation layer 121 is also referred to as deep trench isolation (DTI), and the second separation layer 122 is also referred to as shallow trench isolation (STI). The second separation layer 122 may be disposed on upper surfaces of the first and second active regions ACT1 and ACT2. A portion of the active pattern 105 may protrude above the second separation layer 122.

For example, the device separation layer 120 may include silicon oxide or a silicon oxide-based insulating material, e.g., tetraethyl orthosilicate (TEOS), undoped silicate glass (USG), phosphosilicate glass (PSG), borosilicate glass (BSG), borophosphosilicate glass (BPSG), fluoride silicate glass (FSG), spin on glass (SOG), Tonen Silazene (TOSZ), or a combination thereof. The device separation layer 120 may be formed using, e.g., a chemical vapor deposition (CVD) or spin coating process.

The gate structure GS illustrated in FIG. 1 has a line shape extending, e.g., lengthwise, in the second direction (e.g., D2) and may overlap a region of the active pattern 105. Referring to FIG. 2, the gate structure GS employed in the present example embodiment may include gate spacers 141, a gate dielectric layer 142 and a gate electrode 145 sequentially disposed between the gate spacers 141, and a gate capping layer 147 disposed on the gate electrode 145.

For example, the gate spacers 141 may include an insulating material, e.g., SiOCN, SiON, SiCN, or SiN. For example, the gate dielectric layer 142 may be formed of a silicon oxide layer, a high-κ layer, or a combination thereof. The high-κ layer may include a material having a dielectric constant (e.g., about 10 to 25) higher than that of a silicon oxide layer, e.g., at least one of hafnium oxide, hafnium oxynitride, hafnium silicon oxide, lanthanum oxide, lanthanum aluminum oxide, and a combination thereof The gate dielectric layer 142 may be formed by, e.g., an atomic layer deposition (ALD) process, a chemical vapor deposition (CVD) process, or physical vapor deposition (PVD) process.

In some example embodiments, the gate electrode 145 may include first and second gate electrodes formed of different materials. The first gate electrode may adjust a work function and fill a space formed over the first gate electrode. For example, the first gate electrode may include a metal nitride, e.g., titanium nitride (TiN), tantalum nitride (TaN), or tungsten nitride (WN), and the second gate electrode may include a metal material, e.g., aluminum (Al), tungsten (W), or molybdenum (Mo), or a semiconductor material, e.g., doped polysilicon. For example, the gate capping layer 147 may be formed of an insulating material, e.g., silicon nitride.

The interlayer insulating layer 130 may be disposed on the device separation layer 120 to cover the source/drain regions 110. The interlayer insulating layer 130 may have an upper surface that is substantially flat and coplanar with an upper surface of the gate capping layer 147. The interlayer insulating layer 130 may be formed of the same or similar material to the aforementioned material of the device separation layer 120. In some example embodiments, the interlayer insulating layer 130 may be formed by a process different from that of the device separation layer 120 to have different film qualities.

The device substrate structure DS according to the present example embodiment includes a through-via structure 150 passing through the interlayer insulating layer 130 and the first semiconductor substrate 101. For example, the through-via structure 150 may be a through-silicon via (TSV). The through-via structure 150 may also pass through the device separation layer 120 between the interlayer insulating layer 130 and the first semiconductor substrate 101. In the present example embodiment, the through-via structure 150 may be located in the second separation layer 122, i.e., in a substrate region between the first and second active regions ACT1 and ACT2. For example, as illustrated in FIG. 2, the through-via structure 150 may continuously extend through an entire thickness of the first semiconductor substrate 101 and an entire thickness of the first semiconductor substrate 101, while being horizontally spaced apart from each of the first and second active regions ACT1 and ACT2, e.g., a portion of the first separation layer 121 may be between the through-via structure 150 and a lateral sidewall of each of the first and second active regions ACT1 and ACT2. In another example embodiment, the through-via structure (refer to 150B of FIG. 4) may be located on the active region.

The through-via structure 150 may be formed from the interlayer insulating layer 130 before a first wiring portion 170 is formed. The through-via structure 150 may have a width narrowing toward a second surface 101B of the first semiconductor substrate 101, e.g., the width of the through-via structure 150 in the second direction my decrease as a distance along the third direction D3 from the second surface 101B of the first semiconductor substrate 101 decreases. The through-via structure 150 may include a conductive material 155 and an insulating barrier 151 disposed between the conductive material 155 and the first semiconductor substrate 101. For example, the conductive material 155 may include Cu, Co, Mo, Ru, W, or alloys thereof. For example, the insulating barrier 151 may include $SiO_2$, SiN, SiCN, SiC, SiCOH, SiON, $Al_2O_3$, or AlN.

The through-via structure 150 may be electrically connected to the contact structure 160. For example, as illustrated in FIG. 2, the through-via structure 150 may extend continuously from the device separation layer 120 and through the interlayer insulating layer 130 to have its upper surface contact a lower portion of the contact structure 160.

Similar to the through-via structure 150, the contact structure 160 may be formed before the formation of the first wiring portion 170. In the present example embodiment, the contact structure 160 may be formed after the through-via structure 150 is formed. The contact structure 160 employed in the present example embodiment extends, e.g., lengthwise, in the second direction (e.g., D2) within the interlayer insulating layer 130. For example, as illustrated in FIG. 2, the contact structure 160 may have an extension 160E connected to an upper end, e.g., the upper surface, of the through-via structure 150. In another example (FIG. 8), the through-via structure 150 may be connected to the contact structure 160 through the first wiring portion 170. The through-via structure 150 may be electrically connected to an active pattern of another device through the first wiring portion 170.

The contact structure 160 may include a contact plug 165 and a conductive barrier 162 disposed on a side surface and a lower surface of the contact plug 165. For example, the contact plug 165 may include Cu, Co, Mo, Ru, W, or alloys thereof. For example, the conductive barrier 162 may include Ta, TaN, Mn, MnN, WN, Ti, TiN, or a combination thereof. The contact structure 160 may further include a metal silicide layer disposed between the conductive barrier 162 and the source/drain regions 110. For example, the metal silicide layer may be formed of CoSi, NiSi, or TiSi.

The first wiring portion 170 may be formed on the interlayer insulating layer 130. The first wiring portion 170 includes a dielectric layer 171 and a first wiring layer 175. The first wiring layer 175 may include a first metal line M1 and a first metal via V1. The first wiring layer 175 may be configured to be electrically connected to the contact structure 160 and the through-via structure 150. For example, as illustrated in FIG. 2, the first wiring layer 175 may be directly connected to the contact structure 160 through the first metal via V. In another example (FIG. 7), the first wiring layer 175 may be directly connected to the through-via structure 150 through a first metal via V1. For example, the second wiring layer 275 may be formed using a dual damascene process. In the present example embodiment, the first wiring layer 175 is illustrated as having a single-layer structure, but in some example embodiments, it may be implemented to have a multi-layer structure.

The through-via structure 150 employed in the present example embodiment is provided as a path for supplying power required for the devices implemented on the device substrate structure DS, i.e., the first surface 101A of the first semiconductor substrate 101.

As described above, the semiconductor device 100 according to the present example embodiment may include a power supply substrate structure PS electrically connected to the device substrate structure DS and supplying power from an external circuit to the device substrate structure DS (e.g., to the active pattern 105). In the present example embodiment, the first bonding structure 180 and the second bonding structure 280 may be formed on one side of the device substrate structure DS and one side of the power supply substrate structure PS, e.g., between the device substrate structure DS and the power supply substrate structure PS.

Figure 3:
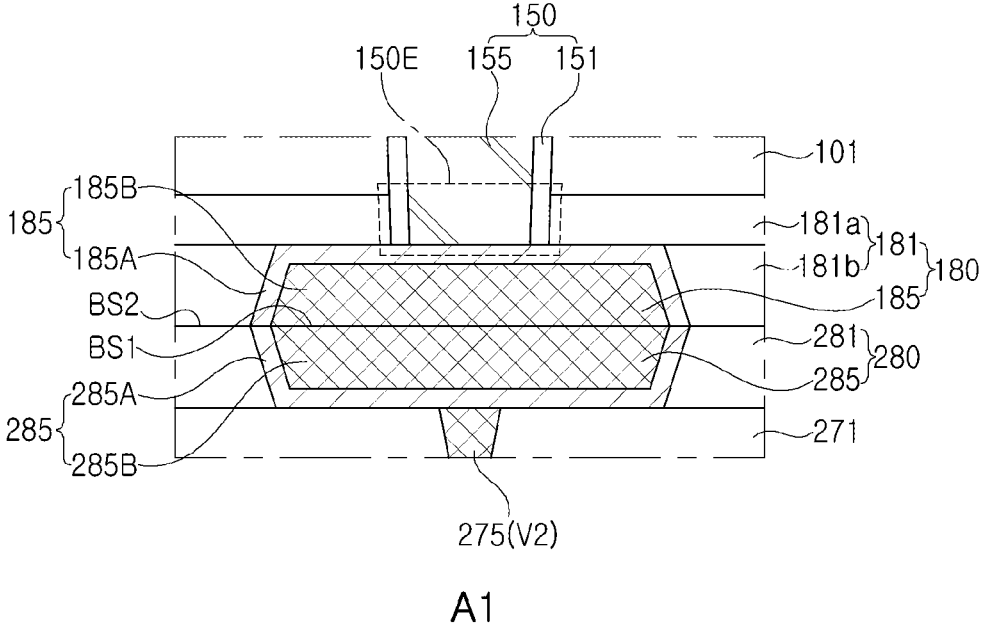
FIG. 3 is an enlarged cross-sectional view of section "A1" in FIG. 2.

Referring to FIGS. 2 and 3, the first bonding structure 180 provided on one side of the device substrate structure DS may include a first insulating layer 181 disposed on the second surface 101B of the first semiconductor substrate 101 and a first connection pad 185 embedded in the first insulating layer 181 and connected to the through-via structure 150. For example, as illustrated in FIG. 2, the first insulating layer 181 may be between the second surface 101B of the first semiconductor substrate 101 and the second bonding structure 280.

As illustrated in FIG. 3, the through-via structure 150 may have a protruding portion 150E that protrudes from the second surface 101B of the first semiconductor substrate 101 into the first bonding structure 180, i.e., into the first insulating layer 181. A bottom surface of the protruding portion 150E may be provided by the conductive material 155.

The first insulating layer 181 may include a first insulating film 181a and a second insulating film 181b. The first insulating film 181a may be on the second surface 101B of the first semiconductor substrate 101, and may have a bottom surface substantially coplanar with a bottom surface of the protruding portion 150E. The second insulating film 181b may be on the first insulating film 181a, and may have a bottom surface substantially coplanar with a bottom sur- face of the first connection pad 185. The bottom surfaces of the elements in the first bonding structure 180 refer to surfaces facing away from the device substrate structure DS.

A second bonding structure 280 provided on one side of the power supply substrate structure PS includes a second insulating layer 281 disposed on the first bonding structure 180 and bonded to the first insulating layer 181, and a second connection pad 285 embedded in the second insulating layer 281 and bonded to the first connection pad 185. The second connection pad 285 may be formed to have a surface substantially coplanar with a surface of the second insulating layer 281. Since the bonded surface is formed to be suffi- ciently clean and flat, voids may not occur at the bonded interface and strong bonding may be ensured.

By using the first and second bonding structures 180 and 280, the device substrate structure DS may be hybrid bonded to the power supply substrate structure PS so that an electrical connection path is formed with each other. That is, the first and second bonding structures 180 and 280 may be bonded to each other both via direct metal bonding and via direct dielectric bonding, thereby improving the bonding (via the dielectric bonding) and the electrical connection path (via the metal bonding) between the device substrate structure DS and the power supply substrate structure PS.

In detail, the first connection pad 185 and the second connection pad 285 may include the same metal, e.g., copper (Cu). The directly bonded first and second connection pads 185 and 285 may be bonded by copper interdiffusion through a high-temperature annealing process (refer to BS1). The metal constituting the first and second connection pads 185 and 285 is not limited to copper and may include other metal materials (e.g., Au) that may be bonded to each other similarly. In such a bonded metal interface BS1, electrical connection together with strong bonding may be achieved.

The first insulating layer 181 and the second insulating layer 281 may include the same dielectric material, e.g., silicon oxide. Direct bonding of the first and second insu- lating layers 181 and 281 may be performed by applying a high-temperature annealing process, in a state in which the two insulating layers 181 and 281 are in direct contact with each other. Robust bonding may be implemented through chemical bonding at the bonded dielectric interface BS2.

In some example embodiments, the interfacial layer of the first and second insulating layers 181 and 281 may include other insulating materials. For example, the first and second insulating layers 181 and 281 may include silicon oxide, and, on the surfaces to be bonded of the first and second insulating layers 181 and 281, the first and second connec- tion pads 185 and 285 and other insulating film, e.g., planarized SiCN and SiON or SiCO may be provided as a thin film to form a bonding interface layer.

The first and second connection pads 185 and 285 may be formed on the first and second insulating layers 181 and 281 using a damascene process, respectively, and, as described above, the first and second insulating layers 181 and 281 may be formed to have a flat surface. The first and second connection pads 185 and 285 may include conductive mate- rials 185A and 285A and conductive barriers 185B and 285B disposed on a side surface and respective upper/lower sur- faces of the conductive materials 185A and 285A, e.g., the conductive barriers 185B and 285B may be formed on horizontal surfaces that are not contacting each other. For example, the conductive materials 185A and 285A may include Cu, Co, Mo, Ru, W, or alloys thereof. For example, conductive barriers 185B and 285B may include Ta, TaN, Mn, MnN, WN, Ti, TiN, or a combination thereof.

In this manner, since the power supply substrate structure PS is bonded by hybrid bonding technology using the first and second bonding structures 180 and 280 after the through-via structure 150 is formed, without forming a separate power supply network element (e.g., a buried power rail) on the first semiconductor substrate 101 of the device substrate structure DS, a desired power supply network may be implemented by minimizing defects in the process of forming a conductive element for a separate power supply network on the first semiconductor substrate 101.

As illustrated in FIG. 2, the power supply substrate structure PS employed in the present example embodiment may include a second semiconductor substrate 201 having a second wiring portion 270 disposed on the second bonding structure 280 and a through-via 250 connected to the second wiring portion 270. The second wiring portion 270 includes a second dielectric layer 271 and a second wiring layer 275. The second wiring layer 275 may include a second metal line M2 and a second metal via V2, and may be configured to connect the through-via 250 and the second connection pad 285. For example, the second wiring layer 275 may be formed using a dual damascene process. In the present example embodiment, the second wiring layer 275 is illus- trated as a single-layer structure, but in some example embodiments, it may be implemented as a multi-layer struc- ture.

The through-via 250 may be formed in the second semi- conductor substrate 201 to receive power from an external circuit. In the present example embodiment, the through-via 250 may pass through the second semiconductor substrate 201 to be connected to the second wiring layer 275 (e.g., a landing pad). A protective insulating layer 210 may be formed on a lower surface of the second semiconductor substrate 201, and a bonding pad 292 connected to the through-via 250 and an electrical connection conductor 295, e.g., a solder ball for connection to an external circuit, may be provided.

Similar to the through-via structure 150, the through-via 250 may include a conductive material 255 and an insulating barrier 251 surrounding a side surface of the conductive material 255 to be electrically insulated from the second semiconductor substrate 201. The through-via 250 may have a width narrowing toward the second wiring portion 270, opposite to the direction in which the through-via structure 150 is narrowing.

Figure 4:
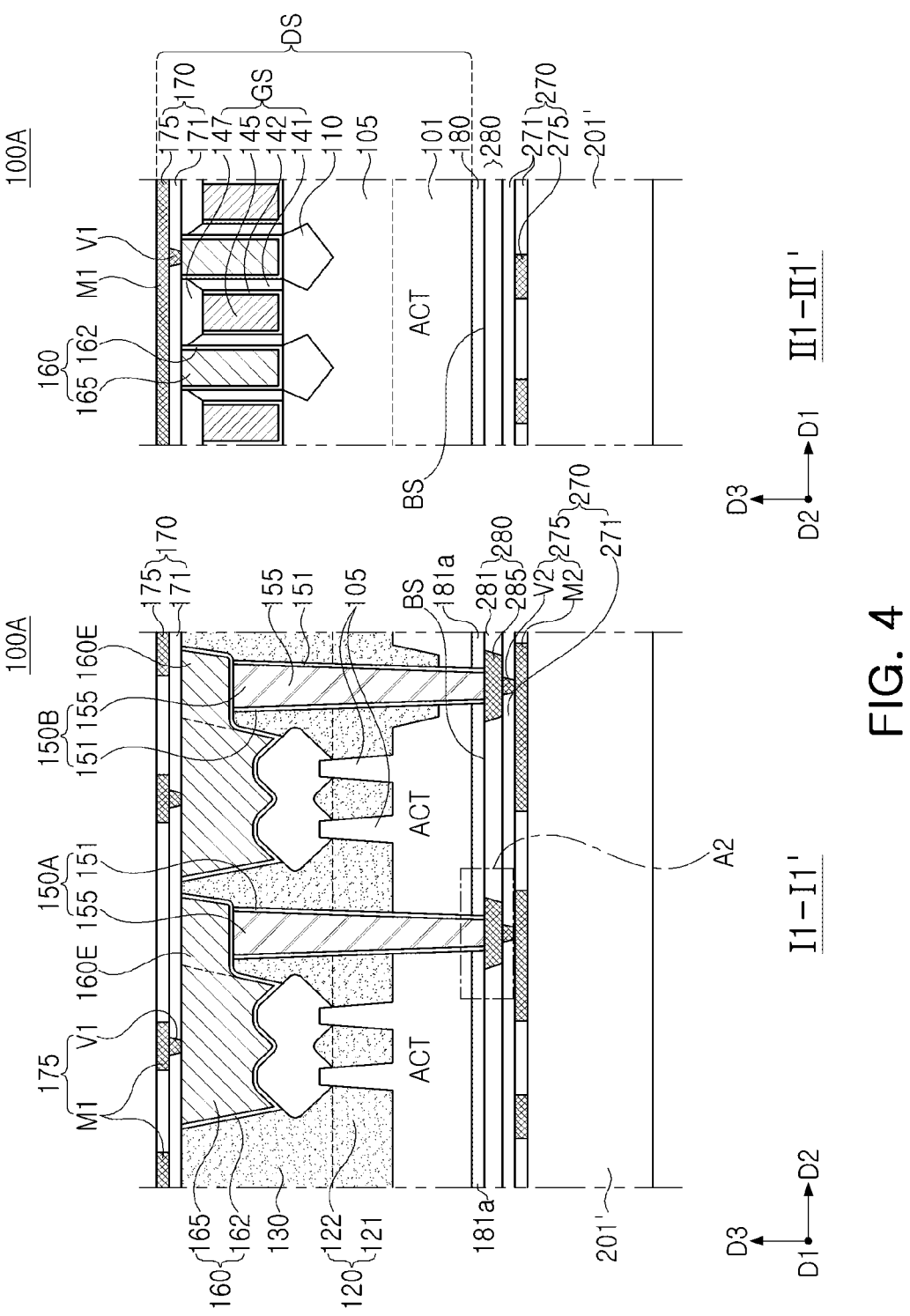
FIG. 4 is a cross-sectional view illustrating a semiconductor device according to an example embodiment.

FIG. 4 is a cross-sectional view illustrating a semicon- ductor device according to an example embodiment.

Referring to FIG. 4, a semiconductor device 100A according to the present example embodiment may be understood as having a structure similar to that of the semiconductor device 100 illustrated in FIGS. 1 through 3, except that a second semiconductor substrate 201' is not implemented as a power supply substrate structure (PS of FIG. 2), so a portion of a second through-via structure 150B passes through the active region ACT, and the first and second through-via structures 150A and 150B are used as metal surfaces for hybrid bonding. In addition, the components of the present example embodiment may be understood with reference to descriptions of the same or similar components of the semiconductor device 100 illustrated in FIGS. 1 to 3, unless otherwise specifically stated.

In the present example embodiment, the second semiconductor substrate 201' may be provided as a substrate structure, other than the substrate structure PS for supplying power. For example, although not illustrated in detail, the second semiconductor substrate 201' may be a semiconductor substrate on which logic and/or memory devices (not shown) are implemented. Similar to the previous example embodiment, the second semiconductor substrate 201' may include the second wiring portion 270 and the bonding structure 280. In some example embodiments, the second semiconductor substrate 201' may be a substrate on which logic and/or memory devices are implemented together with power supply structures similar to those of the previous example embodiment.

In the present example embodiment, the second through-via structure 150B may be formed to pass through the first semiconductor substrate 101 via a deep trench region, i.e., through the first and second separation layers 121 and 122, similarly to the previous example embodiment (i.e., between active regions). The first through-via structure 150A may be formed to pass through the first semiconductor substrate 101 via a shallow trench region, i.e., through the second separation layer 122 and the active region ACT. As such, the first and second through-via structures 150A and 150B may be formed in regions in which a sufficient distance from the device region, e.g., from active pattern 105, is secured.

The hybrid bonding structure employed in the present example embodiment may have a structure different from that of the previous example embodiment. It is noted that while the description below refers to the first through-via structure 150A, the second through-via structure 150B may have a same or similar structure.

Figure 5:
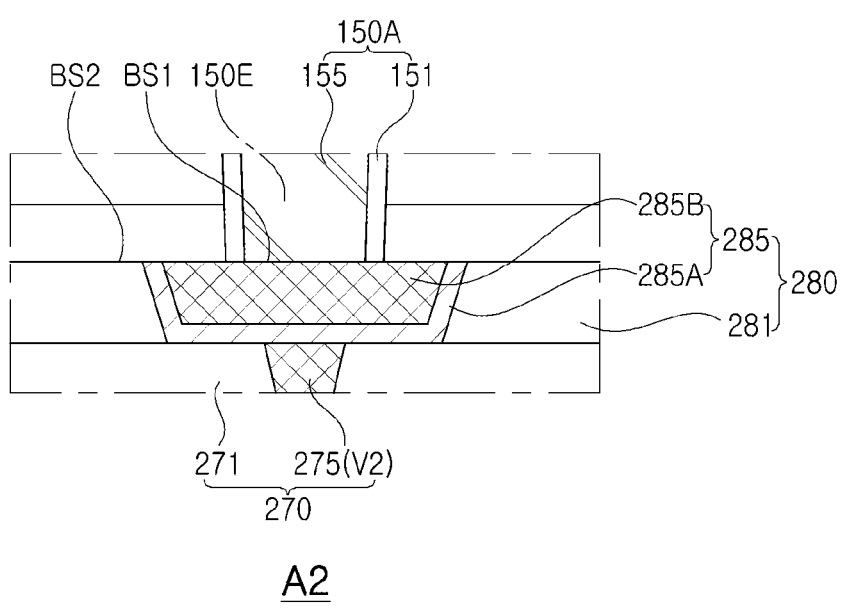
FIG. 5 is an enlarged cross-sectional view of section "A2" in FIG. 4.

In detail, referring to FIGS. 4 and 5, the bonding structure provided on one side of the device substrate structure DS may include the first through-via structure 150A having the protruding portion 150E protruding from the second surface 101B of the first semiconductor substrate 101 into a first insulating film 181a disposed on the second surface 101B of the first semiconductor substrate 101. The protruding portion 150E of the first through-via structure 150A may have a surface on which the conductive material 155 is exposed, and the exposed surface may have a substantially flat surface. For example, as illustrated in FIG. 5, the flat surface of the conductive material 155 of the protruding portion 150E and the bottom surface of the first insulating film 181a may be coplanar with each other. The flat surfaces provided by the first through-via structure 150A and the first insulating film 181a may provide a bonding surface.

The bonding structure 280 provided on one side of the power module substrate structure PS includes a second insulating layer 281 bonded to the first insulating layer 181 and a connection pad 285 embedded in the second insulating layer 281 and bonded to the exposed surface of the first through-via structure 150A. The connection pad 285 may have a relatively smaller size than that of the previous example embodiment. The connection pad 285 may be formed to have a surface substantially coplanar with the surface of the second insulating layer 281.

The exposed surfaces of the first through-via structure 150A and the connection pad 285 may include the same or similar metal, e.g., copper (Cu). These bondable metals are not limited to copper, but may include other metal materials (e.g., Au) that may be similarly bonded to each other. In this metal interface BS1, an electrical connection together with strong bonding may be achieved. The first insulating film 181a and the second insulating layer 281 may include the same dielectric material, e.g., silicon oxide. Direct bonding of the first insulating film 181a and the second insulating layer 281 may also be performed by applying a high-temperature annealing process in a state in which they are in direct contact with each other. Robust bonding may be implemented through chemical bonding at the bonded dielectric interface BS2.

In some example embodiments, an interface between the first insulating film 181a and the second insulating layer 281 may include another insulating material layer. For example, another thin insulating material film, e.g., SiCN, SiON, or SiCO, may be provided as a thin film on a surface to which the first insulating film 181a and the second insulating layer 281 are to be bonded, to form a bonding interface layer.

Figure 6:
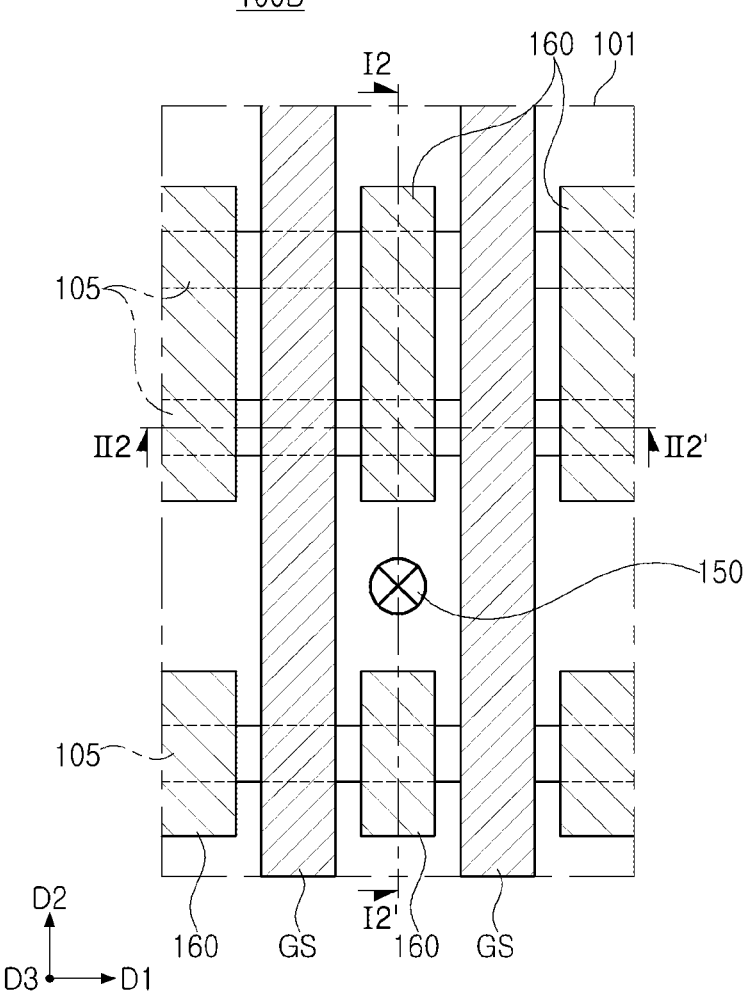
FIG. 6 is a plan view illustrating a semiconductor device according to an example embodiment.
Figure 7:
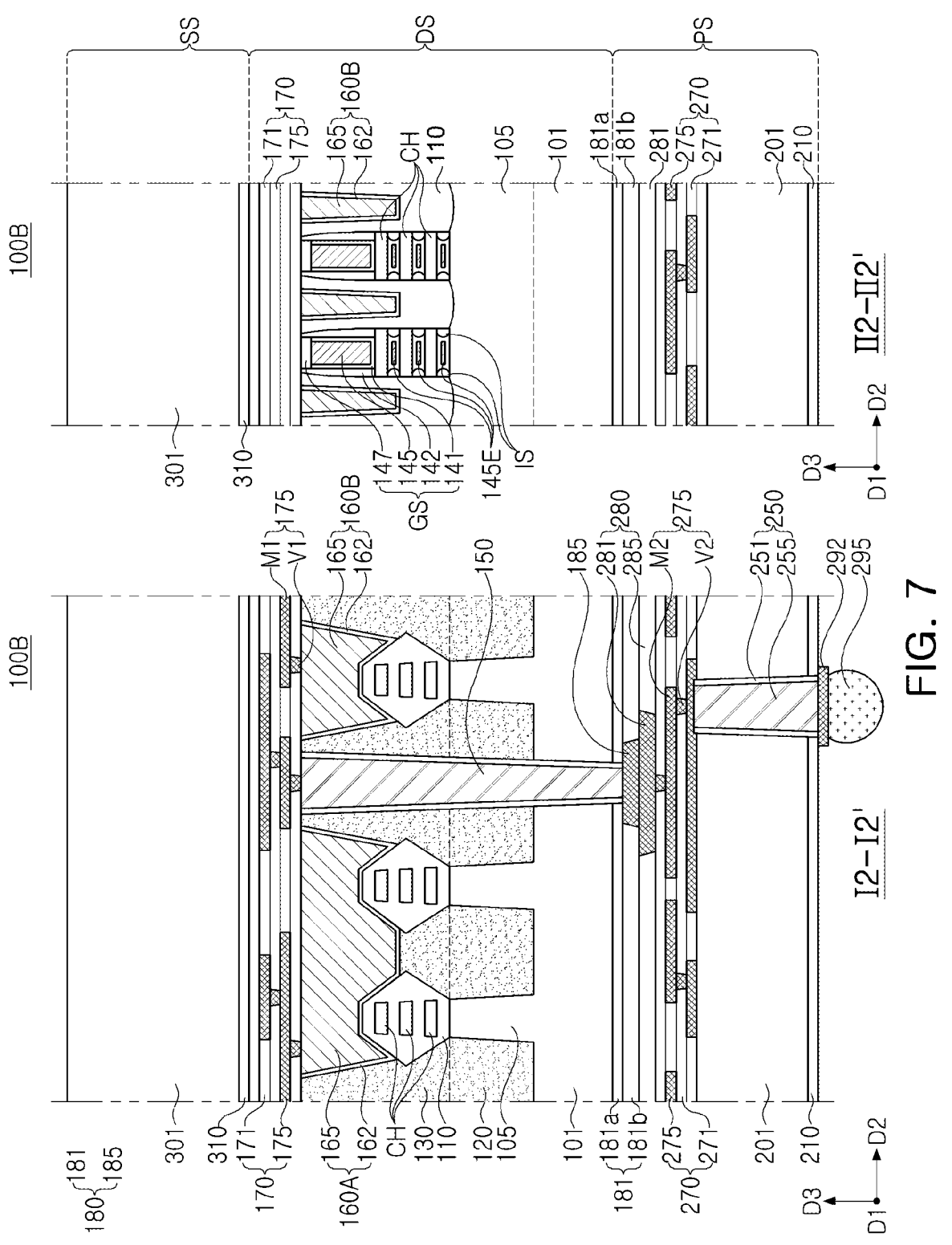
FIG. 7 is a cross-sectional view along lines I2-I2' and II2-II2' of FIG. 6.

FIG. 6 is a plan view illustrating a semiconductor device according to an example embodiment, and FIG. 7 is a cross-sectional view of the semiconductor device illustrated in FIG. 6, taken along lines I2-I2' and II2-II2'.

Referring to FIGS. 6 and 7, a semiconductor device 100B according to the present example embodiment may be understood as having a structure similar to that of the semiconductor device 100 illustrated in FIGS. 1 to 3, except that it has a multi-channel structure including a plurality of channel layers CH on each of the active patterns 105. Further, the semiconductor device 100B includes a support substrate structure SS disposed on the device substrate structure DS, and the first and second wiring portions 170 and 270 are implemented as a plurality of wiring layers. In addition, the components of the present example embodiment may be understood with reference to descriptions of the same or similar components of the semiconductor device 100 illustrated in FIGS. 1 to 3, unless otherwise specifically stated.

The semiconductor device 100B according to the present example embodiment may have a transistor (i.e., MBCFET®) structure including a plurality of channel layers formed of nanosheets. The semiconductor device 100B may further include a plurality of nanosheet-shaped channel layers CH spaced apart from each other in the third direction (e.g., D3) and internal spacers IS disposed to be parallel to the gate electrode 145 between the plurality of channel layers CH. In the semiconductor device 100B, a portion 145E of the gate electrode 145 may include transistors having a gate-all-around structure disposed between the active pattern 105 and the lowermost channel layers CH and between the plurality of channel layers CH. For example, each transistor of the semiconductor device 100B may include channel layers CH, the source/drain region 110, and the gate electrode 145.

Two or more of the plurality of channel layers CH may be disposed to be spaced apart from each other in the third direction (e.g., D3) on the active pattern 105. The channel layers CH may be connected to the source/drain regions 110 and may be spaced apart from upper surfaces of the active pattern 105. The channel layers CH may have the same or similar width as that of the active pattern 105 in the second direction (e.g., D2), and may have the same or similar width as that of the gate structure GS in the first direction (e.g., D1). However, when the internal spacers IS are employed, the channel layers CH may have a width reduced than that of the side surfaces below the gate structure GS.

The plurality of channel layers CH may be formed of a semiconductor material, and may include, e.g., at least one of silicon (Si), silicon germanium (SiGe), and germanium (Ge). The channel layers CH may be formed of, e.g., the same material as the first semiconductor substrate 101 (particularly, the active region). The number and shape of the channel layers CH constituting a single channel structure may be variously changed in the example embodiments.

The internal spacers IS may be disposed on both side surfaces of the gate electrode 145 in the first direction (e.g., D1) between the plurality of channel layers CH. The gate electrode 145 may be electrically separated from the source/drain regions 110 by the internal spacers IS. The internal spacers IS may have a flat side surface facing the gate electrode 145 or a cross-section convexly rounded toward the gate electrode 145 (refer to FIG. 7). The internal spacers IS may be formed of, e.g., oxide, nitride, or oxynitride, and in particular, may be formed of a low-k film.

As described above, the semiconductor device according to the present example embodiment may be applied to transistors having various structures. In addition to the aforementioned example embodiments, the semiconductor device according to the present example embodiment may be implemented as a semiconductor device including a vertical FET (VFET) having an active region extending perpendicularly to the upper surface of the first semiconductor substrate 101 and a gate structure surrounding the active region, or a semiconductor device including a negative capacitance FET (NCFET) using a gate insulating layer having ferroelectric properties.

In the present example embodiment, a support substrate structure SS may be additionally disposed on the device substrate structure DS. The support substrate structure SS may be bonded to the first wiring portion 170 before a grinding process of the first semiconductor substrate 101, and may remain in a final structure. The support substrate structure SS may include a support substrate 301 and a bonding insulating layer 310 disposed on the support substrate 301, e.g., the bonding insulating layer 310 may be between the support substrate and the device substrate structure DS. For example, the bonding insulating layer 310 may include $SiO_2$, SiCN, SiON, or SiCO. The bonding insulating layer 310 of the support substrate structure SS may be directly bonded to the dielectric layer 171 of the first wiring portion 170. In another example embodiment, the support substrate 301, e.g., a silicon substrate, may be directly bonded to the device substrate structure DS using a planarized surface. This process may be performed by a wafer-to-wafer process.

The first wiring portion 170 disposed on the interlayer insulating layer 130 and the second wiring portion 270 disposed on the second semiconductor substrate 201 may include two wiring layers 175 and 275, respectively, but in other example embodiments, the first wiring portion 170 and the second wiring portion 270 may be implemented with a different number of layers.

The power supply substrate structure PS employed in the present example embodiment may include the second semiconductor substrate 201 and the through-via 250 passing through the second semiconductor substrate 201 to be connected to the second wiring layer 275 of the second wiring portion 270. Also, similarly to the previous example embodiment, the protective insulating layer 210 may be formed on a surface of the second semiconductor substrate 201, and the bonding pad 292 connected to the through-via 250 and the electrical connection conductor 295, e.g., a solder ball for connection to an external circuit, may be included.

FIGS. 8 to 15 are cross-sectional views of stages in a method of manufacturing the semiconductor device illustrated in FIG. 7.

Figure 8:
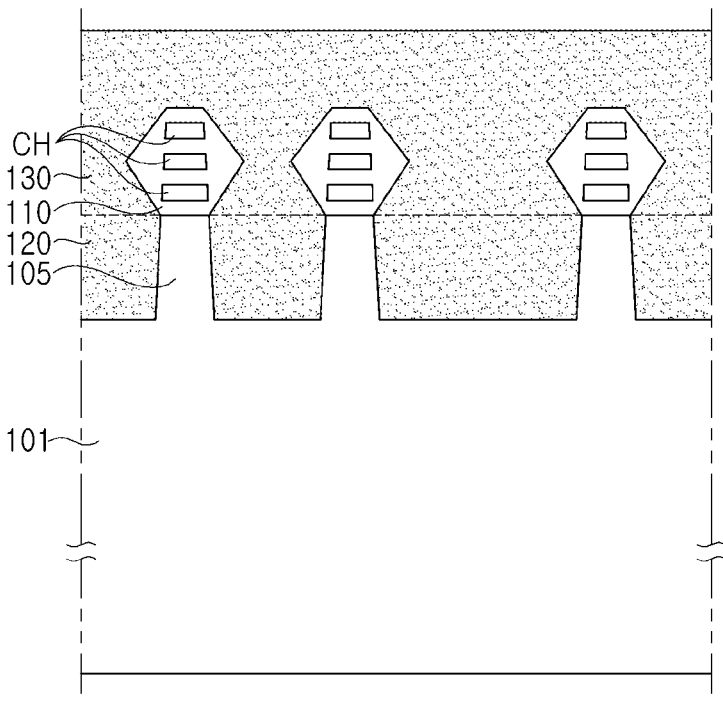
FIGS. 8 to 15 are cross-sectional views of stages in a method of manufacturing the semiconductor device illustrated in FIG. 7.

Referring to FIG. 8, the plurality of channel layers CH may be formed on an upper surface of each of the plurality of active patterns 105 in the third direction, the source/drain region 110 connected to both ends of the plurality of channel layers CH may be formed on the active pattern 105, and the interlayer insulating layer 130 may be formed to cover the source/drain regions 110 on the device separation layer 120. As illustrated in FIG. 7, a gate structure may be formed using a dummy gate structure.

In the present example embodiment, instead of directly forming a conductor element (e.g., a buried power rail (BPN)) for constituting a power supply network on the first semiconductor substrate, a through-via structure is formed in a process for forming a contact structure.

Figure 9:
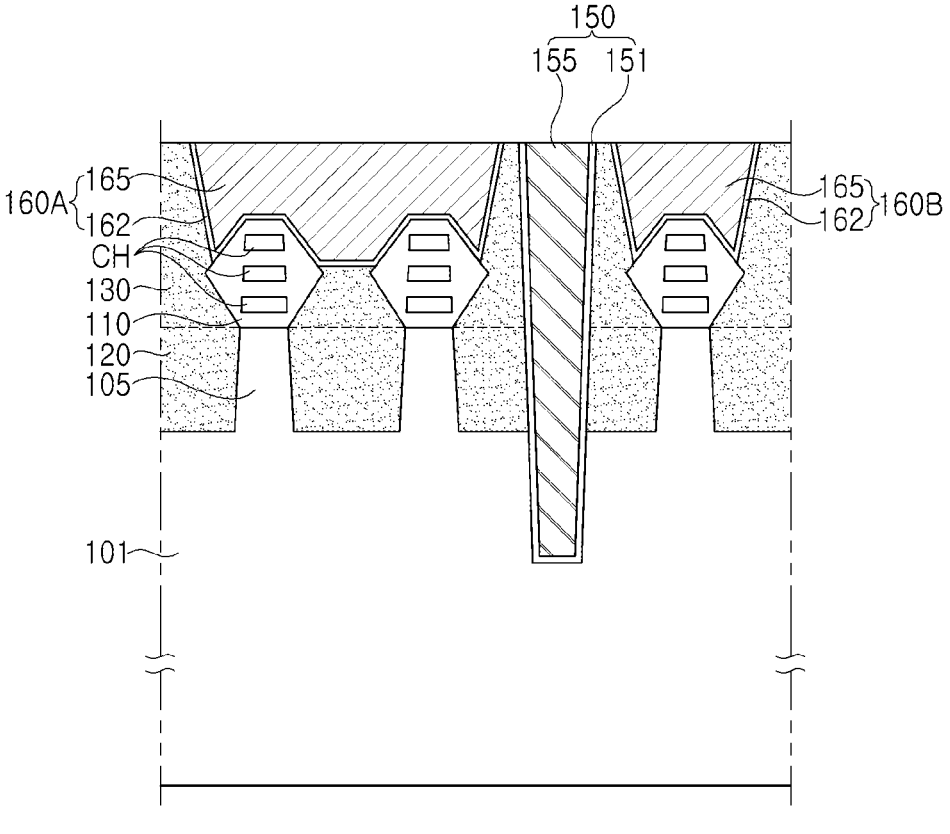

Next, referring to FIG. 9, the through-via structure 150 and the contact structure 160 are formed.

The through-via structure 150 may be formed by a process of forming a through-hole to a desired depth. The through-hole may be formed through the interlayer insulating layer 130 and the device separation layer 120 to a predetermined depth within the first semiconductor substrate 101. The insulating barrier 151 may be formed on an inner surface of the through-hole, and then the through-hole may be filled with the conductive material 155. Portions of the insulating barrier 151 and the conductive material 155 on the interlayer insulating layer 130 may be removed through a planarization process, e.g., chemical mechanical polishing (CMP). The through-via structure 150 may be formed to extend through the interlayer insulating layer 130 and the device separation layer 120 to a partial region of the first semiconductor substrate 101. The through-via structure 150 may be formed to have a relatively high aspect ratio.

Similarly, the contact structure 160 may be formed by a process of forming a contact hole up to the source/drain region 110, forming the conductive barrier 162 on an inner surface of the contact hole, and then filling the contact hole with the contact plug 165. Also, portions of the conductive barrier 162 and the contact plug 165 on the interlayer insulating layer 130 may be removed through a planarization process, e.g., CMP.

In this manner, before the first wiring portion (170 of FIG. 10), i.e., BEOL, is formed, the through-via structure 150 may be formed together with the contact structure 160. For example, as illustrated in FIG. 9, upper surfaces of the through-via structure 150 and the contact structure 160 may be coplanar.

Figure 10:
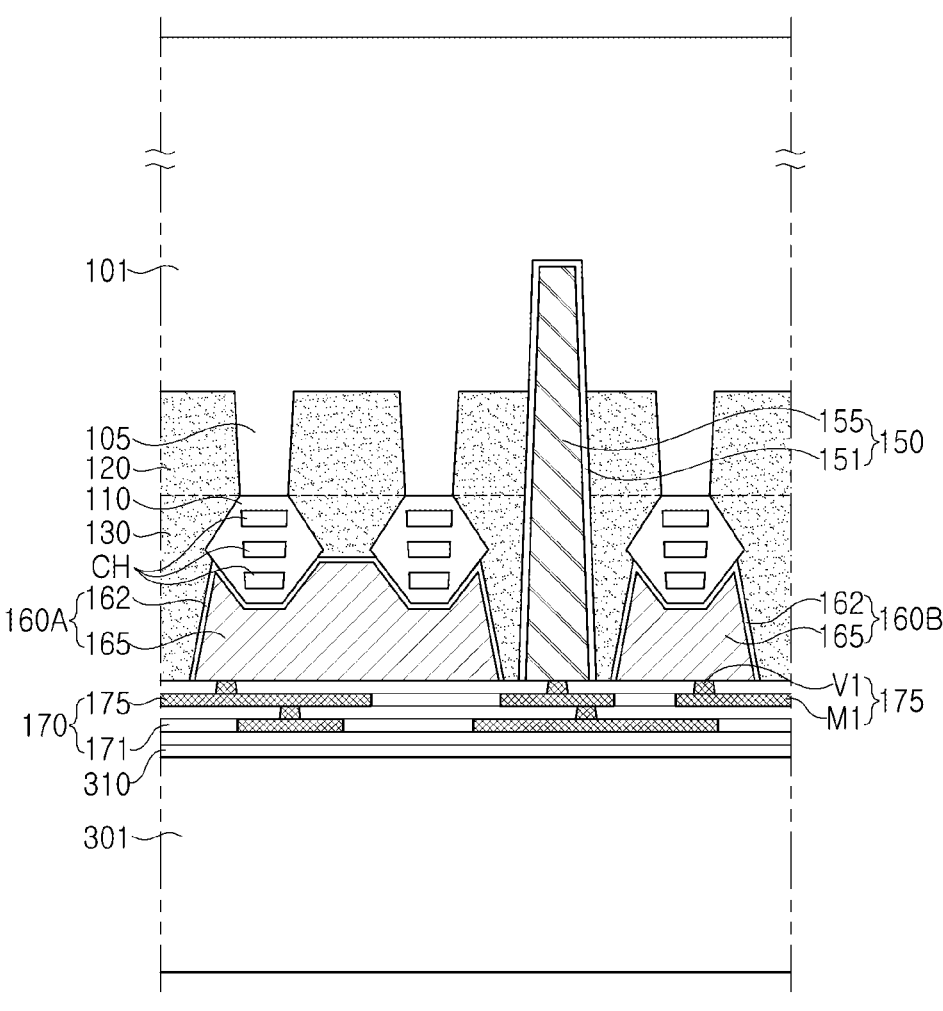

Next, referring to FIG. 10, the first wiring portion 170 may be, e.g., continuously, formed on the coplanar upper surfaces of the through-via structure 150 and the contact structure 160. Then, the first wiring portion 170 may be bonded to the support substrate 301 on the device substrate structure SS.

In detail, the first wiring portion 170 connected to the contact structure 160 may be formed on the interlayer insulating layer 130. An etch stop layer may be formed on the interlayer insulating layer 130, and a plurality of the dielectric layers 171 and the first wiring layer 175 including the metal line M1 and the metal via V1 may be formed. The metal wiring M1 and the metal via V1 may be formed together using a dual damascene process.

The bonding insulating layer 310 may be formed on the support substrate 301. For example, the bonding insulating layer 310 may include $SiO_2$, SiCN, SiON, or SiCO. The bonding insulating layer 310 may be directly bonded to the dielectric layer 171 of the first wiring portion 170. This process may be performed by a wafer-to-wafer process. The support substrate 301 may be used as a support structure during a grinding process of the first semiconductor substrate 101. In another example embodiment, the support substrate 301, e.g., a silicon substrate, may be directly bonded to the device substrate structure DS using a planarized surface.

Figure 11:
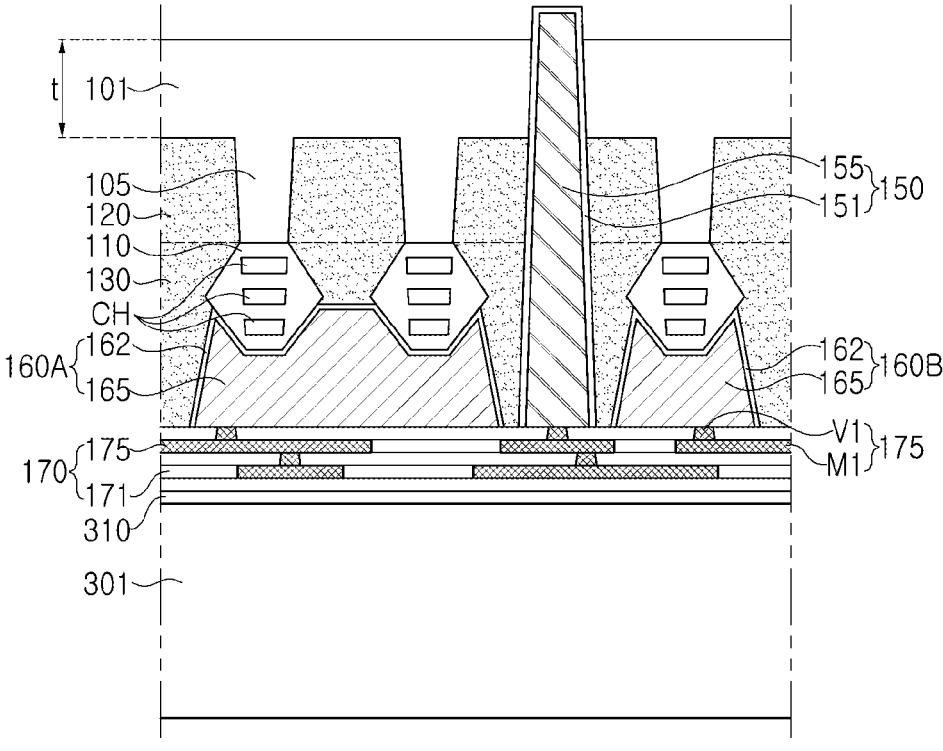

Next, referring to FIG. 11, a polishing process for reducing a thickness of the first semiconductor substrate 101 is performed using the support substrate 301.

The present polishing process may be performed by a CMP process on the second surface 101B of the first semiconductor substrate 101. Through this process, the first semiconductor substrate 101 may be reduced to a desired thickness t, and one end of the through-via structure 150 may be exposed from the second surface 101B of the first semiconductor substrate 101, e.g., the through-via structure 150 may protrude out of (e.g., above) the first semiconductor substrate 101 to a predetermined distance in the third direction D3 (e.g., in a direction oriented away from the channel layers CH). After the polishing process, the thickness t of the first semiconductor substrate 101 may be about 1 μm or less.

Figure 12:
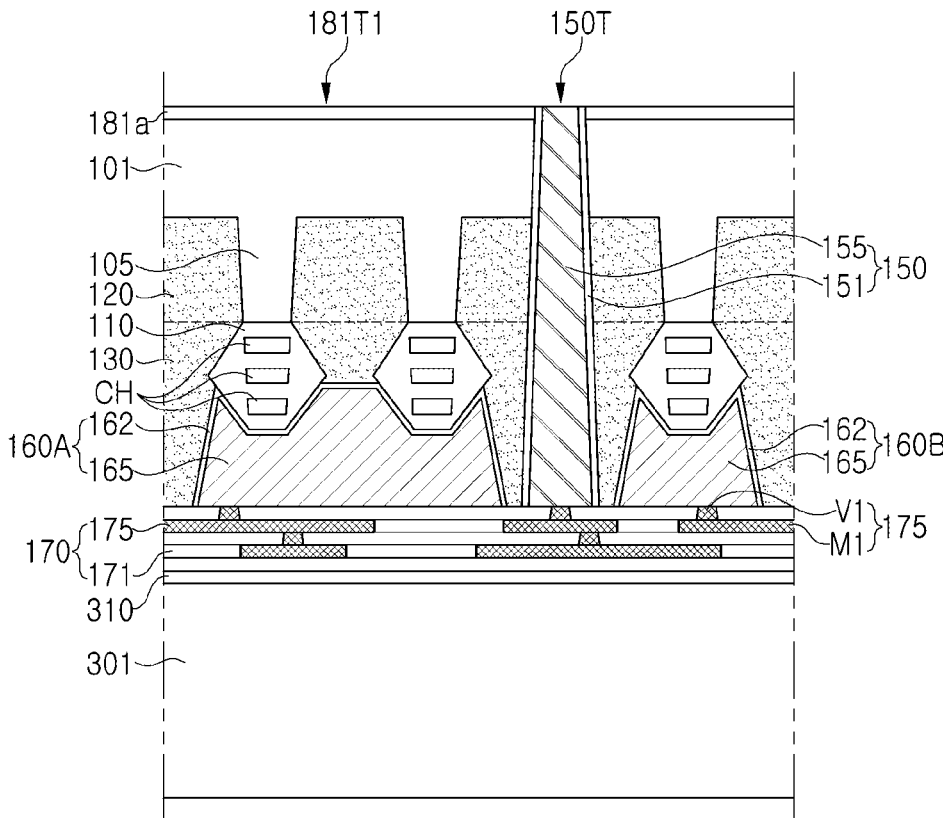

Next, referring to FIG. 12, the first insulating film 181*a* may be formed on the first semiconductor substrate 101 to cover the portion of the through-via structure 150 protruding above the first semiconductor substrate 101 (i.e., the protruding portion 150E in FIG. 3). A process of planarizing the protruding portion of the through-via structure 150 and the first insulating layer 180*a* may be performed.

Such a planarization process may also be performed by a CMP process. After the planarization process, the protruding portion of the through-via structure 150 may have a surface 150T substantially coplanar with the surface 181T1 of the first insulating film 181*a*. The surface 150T of the protruding portion may be provided by the conductive material 155 after the insulating barrier 151 is removed. This planarized surface may be used as a direct bonding surface. For example, the surface 150T of the protruding portion 150E of the through-via structure 150 may be bonded in a subsequent process to the surface of a connection pad in a similar way to that illustrated in FIGS. 4 and 5.

Figure 13:
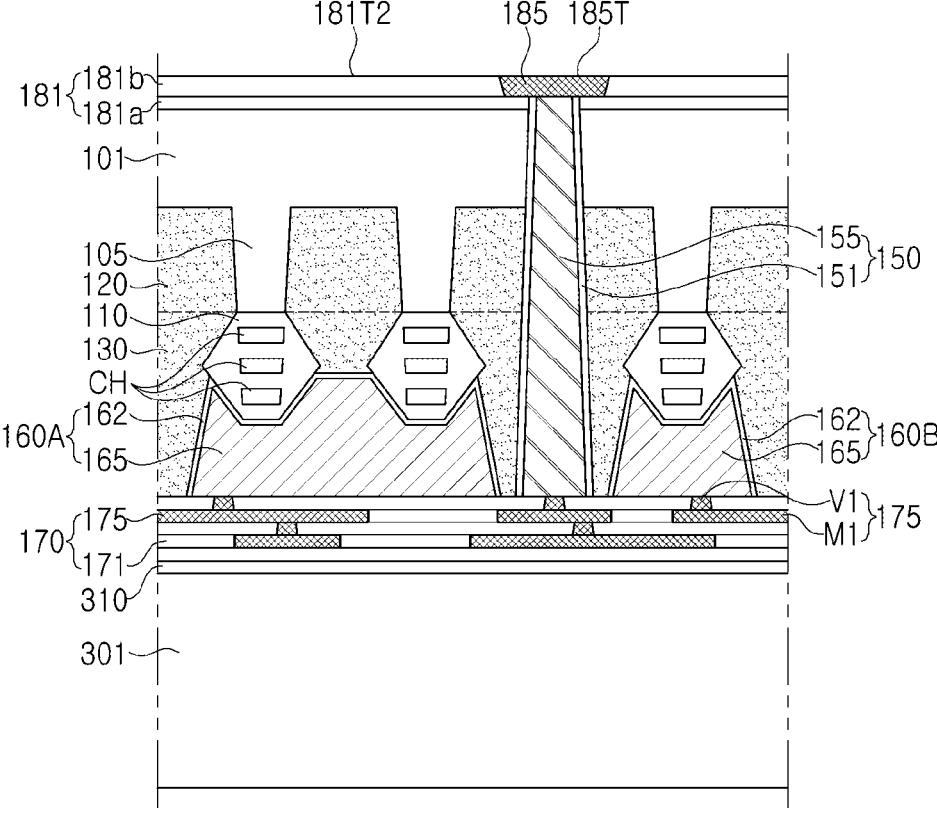

Next, referring to FIG. 13, the second insulating film 181*b* may be formed on the first insulating film 181*a*, and the first connection pad 185 connected to the through-via structure 150 embedded in the second insulating film 181*b* may be formed to form the first bonding structure 180.

The first connection pad 185 may be formed on the second insulating film 181*b* using a damascene process. In the planarization process employed in the damascene process, a surface 181T2 of the second insulating film 181*b* may be substantially planarized with a surface 185T of the first connection pad 185.

Figure 14:
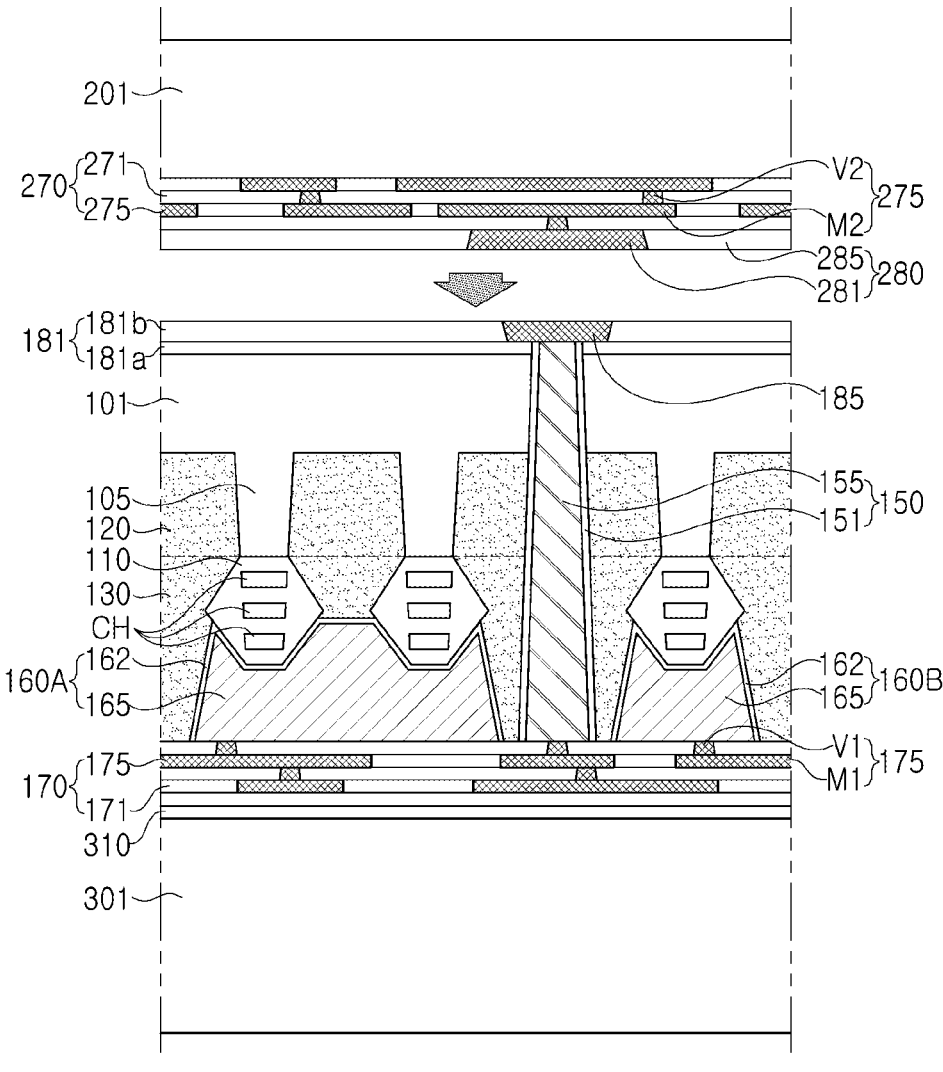

Next, referring to FIG. 14, after the power supply substrate structure PS having the second bonding structure 280 is formed, the second bonding structure 280 may be bonded to the first bonding structure 180.

The power supply substrate structure PS includes the second semiconductor substrate 201, the second wiring portion 270 disposed on the second semiconductor substrate 201, and the second bonding structure 280 disposed on the second wiring portion 270. The second bonding structure 280 may be disposed on and bonded to the first bonding structure 180. The second bonding structure 280 includes the second insulating layer 281 bonded to the first insulating layer 181 and the second connection pad 285 embedded in the second insulating layer 281 and bonded to the first connection pad 185. The second connection pad 285 may be formed to have a surface substantially coplanar with the surface of the second insulating layer 281.

The first connection pad 185 and the second connection pad 285 may be provided as a rigid bonding structure together with an electrical path for the device substrate structure DS and the power supply substrate structure PS.

Figure 15:
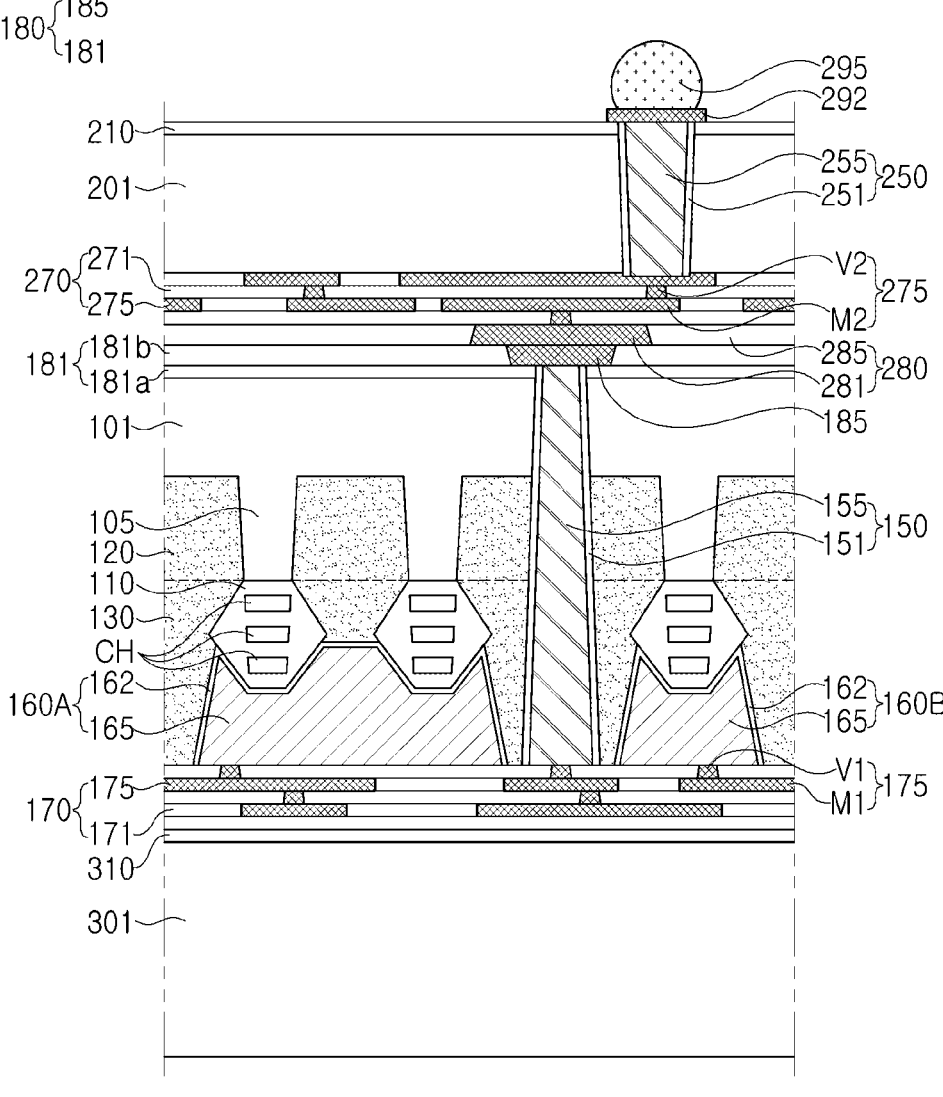

Next, referring to FIG. 15, the second semiconductor substrate 201 is worked to form the power supply substrate structure PS having a structure connectable to an external circuit.

The through-via 250 may be formed in the second semiconductor substrate 201 to receive power from an external circuit. In the present example embodiment, the through-via 250 may pass through the second semiconductor substrate 201 to be connected to the second wiring layer 275 (e.g., a landing pad). Additionally, the protective insulating layer 210 may be formed on a lower surface of the second semiconductor substrate 201, and the bonding pad 292 connected to the through-via 250 and the electrical connection conductor 295, e.g., a solder ball for connection to an external circuit, may be included.

In this manner, power may be supplied to the device substrate structure DS by using the additional power supply substrate structure PS using the electrical path (e.g., the first and second connection pads) formed by hybrid bonding with the through-via structure 150 of the first semiconductor substrate 101.

By way of summation and review, there is a need for a method of forming a conductive through-structure, e.g., a through-silicon via (TSV), from the backside of the semiconductor substrate to the BEOL. Therefore, aspects of embodiments provide a semiconductor device having improved connection reliability by simplifying a structure of a conductive through-structure.

That is, according to the example embodiments described above, a through-via structure is formed to pass through the interlayer insulating layer and the first semiconductor substrate, so a first bonding structure is formed on the backside (e.g., a second surface opposite to a surface having the active fins) of the first semiconductor substrate. Such a first bonding structure is hybrid-bonded to a second bonding structure of the second semiconductor substrate (e.g., a PDN substrate), thereby providing a multi-stack semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A semiconductor device, comprising:
a first semiconductor substrate having a first surface and a second surface opposite to each other;
an active pattern protruding from the first surface of the first semiconductor substrate, the active pattern extending in a first direction;
a gate structure in a region of the active pattern, the gate structure extending in a second direction intersecting the first direction;
a source/drain region in the active pattern on a side of the gate structure;
an interlayer insulating layer on the source/drain region;
a contact structure extending through the interlayer insulating layer to connect to the source/drain region;
a through-via structure electrically connected to the contact structure and passing through the interlayer insulating layer and the first semiconductor substrate;
a first bonding structure including a first insulating layer on the second surface of the first semiconductor substrate and a first connection pad embedded in the first insulating layer, the first connection pad being connected to the through-via structure;
a second bonding structure on the first bonding structure and including a second insulating layer bonded to the first insulating layer and a second connection pad embedded in the second insulating layer and bonded to the first connection pad; and
a second semiconductor substrate on the second bonding structure.

2. The semiconductor device as claimed in claim 1, wherein the contact structure has an extension extending in the second direction and connected to the through-via structure.

3. The semiconductor device as claimed in claim 1, further comprising a first wiring portion on the interlayer insulating layer and electrically connected to each of the contact structure and the through-via structure.

4. The semiconductor device as claimed in claim 3, wherein the interlayer insulating layer has an upper surface coplanar with an upper surface of each of the contact structure and the through-via structure.

5. The semiconductor device as claimed in claim 3, further comprising a support substrate on the first wiring portion.

6. The semiconductor device as claimed in claim 5, wherein the support substrate includes a bonding insulating layer bonded to the first wiring portion.

7. The semiconductor device as claimed in claim 1, further comprising a second wiring portion between the second semiconductor substrate and the second bonding structure and electrically connected to the second connection pad.

8. The semiconductor device as claimed in claim 7, wherein the second wiring portion is configured to supply power to the source/drain region through the through-via structure.

9. The semiconductor device as claimed in claim 8, wherein the second semiconductor substrate includes a through-via passing through the second semiconductor substrate and connected to the second wiring portion.

10. The semiconductor device as claimed in claim 1, wherein the second semiconductor substrate includes a semiconductor substrate in which a logic or memory device is implemented.

11. The semiconductor device as claimed in claim 1, wherein the first semiconductor substrate has a thickness of 1 μm or less.

12. The semiconductor device as claimed in claim 1, wherein the through-via structure includes a conductive material and an insulating barrier surrounding a side surface of the conductive material.

13. The semiconductor device as claimed in claim 12, wherein the through-via structure has a portion protruding from the second surface of the first semiconductor substrate, a bottom surface of the portion including the conductive material.

14. The semiconductor device as claimed in claim 13, wherein the first insulating layer includes:
a first insulating film on the second surface of the first semiconductor substrate, the first insulating film having a surface coplanar with the bottom surface of the portion, and
a second insulating film on the first insulating film, the second insulating film having a surface coplanar with a surface of the first connection pad.

15. The semiconductor device as claimed in claim 1, further comprising:
channel layers on the active pattern, the channel layers being spaced apart from each other in a third direction, perpendicular to the first and second directions, and each of the channel layers extending in the first direction,
wherein the gate structure includes a gate electrode surrounding the channel layers and extending in the second direction, and a gate insulating layer between the channel layers and the gate electrode and between the active pattern and the gate electrode.

16. A semiconductor device, comprising:
a device substrate structure including a first semiconductor substrate having a first surface and a second surface opposite to each other and an active pattern protruding from the first surface and extending in a first direction, an interlayer insulating layer on the active pattern, a through-via structure electrically connected to the active pattern and passing through the interlayer insulating layer and the first semiconductor substrate, and a first wiring portion on the interlayer insulating layer;
a first bonding structure including a first insulating layer on the second surface of the first semiconductor substrate and a first connection pad embedded in the first insulating layer and connected to the through-via structure;
a second bonding structure on the first bonding structure and including a second insulating layer bonded to the first insulating layer and a second connection pad embedded in the second insulating layer and bonded to the first connection pad;
a power supply substrate structure including a second wiring portion on the second bonding structure and a second semiconductor substrate having a through-via connected to the second wiring portion; and
a support substrate on the first wiring portion.

17. The semiconductor device as claimed in claim 16, wherein:
the through-via structure has a width narrowing toward the second surface of the first semiconductor substrate, and
the through-via has a width narrowing toward the second bonding structure.

18. The semiconductor device as claimed in claim 16, wherein a bonding interface of the first insulating layer and the second insulating layer includes a material different from a material in other portions of an interface between the first bonding structure and the second bonding structure.

19. A semiconductor device, comprising:
a first semiconductor substrate having a first surface and a second surface opposite to each other;
an active pattern protruding from the first surface of the first semiconductor substrate, the active pattern extending lengthwise in a first direction;
a gate structure in a region of the active pattern, the gate structure extending lengthwise in a second direction intersecting the first direction;
a source/drain region on the active pattern on a side of the gate structure;
an interlayer insulating layer on the source/drain region;
a contact structure extending through the interlayer insulating layer to connect to the source/drain region;
a through-via structure electrically connected to the contact structure;
a first bonding structure including a first insulating layer on the second surface of the first semiconductor substrate and a first connection pad embedded in the first insulating layer, the first connection pad being connected to the through-via structure;
a second bonding structure on the first bonding structure and including a second insulating layer bonded to the first insulating layer and a second connection pad embedded in the second insulating layer and bonded to the first connection pad; and
a second semiconductor substrate on the second bonding structure,
wherein the through-via structure extends from the first bonding structure through at least a portion of the interlayer insulating layer, and
wherein an upper surface of the through-via structure is farther from the first surface of the first semiconductor substrate than an upper surface of the active pattern.

20. The semiconductor device as claimed in claim 19, wherein the upper surface of the through-via structure is farther from the first surface of the first semiconductor substrate than an upper surface of the source/drain region.

* * * * *